(12) United States Patent
Dorman et al.

(10) Patent No.: US 9,664,708 B2
(45) Date of Patent: May 30, 2017

(54) TEST AND MEASUREMENT DEVICE INCLUDING GROOVES FOR RECEIVING PROBES IN A USE POSITION

(71) Applicant: Milwaukee Electric Tool Corporation, Brookfield, WI (US)

(72) Inventors: Justin D. Dorman, Wauwatosa, WI (US); Jason R. Crowe, Seattle, WA (US); Evans H. Nguyen, Renton, WA (US); Dwight Hyland, Brookfield, WI (US)

(73) Assignee: MILWAUKEE ELECTRIC TOOL CORPORATION, Brookfield, WI (US)

( * ) Notice: Subject to any disclaimer, the term of this patent is extended or adjusted under 35 U.S.C. 154(b) by 459 days.

(21) Appl. No.: 14/151,384

(22) Filed: Jan. 9, 2014

(65) Prior Publication Data
US 2015/0192606 A1     Jul. 9, 2015

(51) Int. Cl.
*G01R 1/04* (2006.01)
*G01R 1/067* (2006.01)

(52) U.S. Cl.
CPC ........... *G01R 1/06788* (2013.01); *G01R 1/04* (2013.01)

(58) Field of Classification Search
None
See application file for complete search history.

(56) References Cited

U.S. PATENT DOCUMENTS

| | | | |
|---|---|---|---|
| D154,699 S | 8/1949 | Molloy | |
| 2,581,497 A | 1/1952 | Podell | |
| 3,287,642 A | 11/1966 | Simkins | |
| 3,757,218 A | 9/1973 | Oliverio et al. | |
| 3,946,613 A | 3/1976 | Silver | |
| 3,987,364 A | 10/1976 | MacCormack et al. | |
| D246,094 S | 10/1977 | Jone et al. | |
| 4,105,968 A | 8/1978 | Mobley et al. | |
| 4,176,315 A | 11/1979 | Sunnarborg | |
| 4,259,635 A | 3/1981 | Triplett | |
| D297,917 S | 10/1988 | Adams et al. | |
| 5,029,296 A | 7/1991 | Shang-Wen | |
| D349,860 S | 8/1994 | Omuro et al. | |
| D362,642 S | 9/1995 | Howse | |
| 5,448,162 A | 9/1995 | Beha | |
| 5,543,707 A | 8/1996 | Yoneyama et al. | |
| 5,612,616 A | 3/1997 | Earle | |
| D391,181 S | 2/1998 | Beha | |
| 5,720,628 A | 2/1998 | Usui et al. | |
| 5,729,211 A | 3/1998 | Reichler et al. | |

(Continued)

*Primary Examiner* — Jermele M Hollington
*Assistant Examiner* — Douglas X Rodriguez
(74) *Attorney, Agent, or Firm* — Michael Best & Friedrich LLP

(57) ABSTRACT

A test and measurement device including a housing, a circuit disposed within the housing, and a display located on the housing. The device includes a first probe and a second probe. Each of the first probe and the second probe includes a probe body, a conductive tip, and a probe wire. Each of the first probe and the second probe is coupled to the housing and in electrical communication with the circuit. The device also includes a first groove that has a first projection and a second projection. The first groove is configured to receive one of the probe bodies, and the projections are configured to retain the one of the probe bodies within the first groove. A second groove is configured to receive the other of the probe bodies.

22 Claims, 12 Drawing Sheets

(56) References Cited

U.S. PATENT DOCUMENTS

| | | |
|---|---|---|
| 5,831,430 A | 11/1998 | Pfanstiehl et al. |
| 6,137,285 A | 10/2000 | Walsten et al. |
| D446,137 S | 8/2001 | Chang |
| D446,734 S | 8/2001 | Kuramoto et al. |
| D446,735 S | 8/2001 | McCain |
| 6,400,133 B1 | 6/2002 | Vest et al. |
| 6,525,665 B1 | 2/2003 | Luebke et al. |
| D476,246 S | 6/2003 | Kuramoto et al. |
| 6,731,217 B1 | 5/2004 | Warner |
| 6,980,417 B2 | 12/2005 | Chang |
| 7,224,159 B2 | 5/2007 | Van Deursen et al. |
| 7,242,173 B2 | 7/2007 | Cavoretto |
| 7,304,618 B2 | 12/2007 | Plathe |
| 7,312,602 B2 | 12/2007 | Hoopengarner |
| 7,312,603 B2 | 12/2007 | Luo et al. |
| D559,715 S | 1/2008 | Marzynski et al. |
| 7,439,726 B2 | 10/2008 | Luo et al. |
| 7,557,559 B1 | 7/2009 | Olsson et al. |
| D601,047 S | 9/2009 | Chang |
| 7,659,710 B2 | 2/2010 | Luo et al. |
| D617,225 S | 6/2010 | Marzynski et al. |
| D628,917 S | 12/2010 | Tian |
| D655,212 S | 3/2012 | Wong |
| 8,358,121 B2 | 1/2013 | Hudson et al. |
| 8,405,380 B2 | 3/2013 | Marzynski et al. |
| D679,615 S | 4/2013 | Marzynski et al. |
| D704,579 S | 5/2014 | Heishi et al. |
| D705,099 S | 5/2014 | Heishi et al. |
| D705,681 S | 5/2014 | Morishita et al. |
| D719,040 S | 12/2014 | Crowe et al. |
| D719,471 S | 12/2014 | Gnauck |
| D723,401 S | 3/2015 | Shen |
| D723,959 S | 3/2015 | Huang |
| D724,454 S | 3/2015 | Huang |
| D724,976 S | 3/2015 | Crowe et al. |
| 9,014,907 B2 | 4/2015 | Lipscomb et al. |
| D731,908 S | 6/2015 | Huang |
| D738,242 S | 9/2015 | Crowe et al. |
| 2008/0023310 A1* | 1/2008 | Chong .................. G01R 1/04 200/336 |
| 2011/0156696 A1 | 6/2011 | Cheek et al. |
| 2012/0091998 A1* | 4/2012 | Nguyen .................. G01R 1/203 324/126 |
| 2013/0033253 A1 | 2/2013 | Liu |
| 2013/0093449 A1 | 4/2013 | Laurino et al. |

* cited by examiner

TEST AND MEASUREMENT DEVICE INCLUDING GROOVES FOR RECEIVING PROBES IN A USE POSITION

BACKGROUND

The present invention relates to a test and measurement device.

SUMMARY

In one embodiment, the invention provides a test and measurement device including a housing, a circuit disposed within the housing, and a display located on a first side of the housing. A first probe includes a first probe body, a first conductive tip, and a first probe wire. The first probe couples to the housing and is in electrical communication with the circuit. A second probe includes a second probe body, a second conductive tip, and a second probe wire. The second probe also couples to the housing and is in electrical communication with the circuit. The device also includes a first groove that has a first projection and a second projection. The first groove is configured to receive one of the first probe body or the second probe body, and the first projection and the second projection are configured to retain the one of the first probe body or the second probe body within the first groove. A second groove is configured to receive the other of the first probe body or the second probe body. A first recess is configured to receive one of the first probe body or the second probe body, and a second recess is configured to receive the other of the first probe body and the second probe body. The first groove and the second groove receive the first probe body or the second probe body in a use position. The first recess and the second recess receive the first probe body or the second probe body in a non-use position.

In another embodiment, the invention provides a test and measurement device including a housing, a circuit disposed within the housing, and a display located on a first side of the housing. A first probe includes a first probe body, a first conductive tip, and a first probe wire. The first probe couples to the housing and is in electrical communication with the circuit. A second probe includes a second probe body, a second conductive tip, and a second probe wire. The second probe couples to the housing and is in electrical communication with the circuit. The device includes a first groove and a second groove. The first groove includes a first projection and a second projection. The device also includes a first recess configured to receive one of the first probe body or the second probe body, and a second recess configured to receive the other of the first probe body and the second probe body. In a non-use position, one of the first probe body or the second probe body is received in the first recess and the other of the first probe body or the second probe body is received in the second recess. In a use position, one of the first probe body or the second probe body is received and secured within the first groove.

In another embodiment, the invention provides a test and measurement device including a housing, a circuit disposed within the housing, and a display located on a first side of the housing. A first probe includes a first probe body, a first conductive tip, and a first probe wire. The first probe couples to the housing and is in electrical communication with the circuit. A second probe includes a second probe body, a second conductive tip, and a second probe wire. The second probe couples to the housing and is in electrical communication with the circuit. The device includes a first groove that includes a first projection and a second projection. The first groove includes a first opening having a first width and is configured to receive one of the first probe body or the second probe body. The device also includes a second groove that is configured to receive the other of the first probe body or the second probe body. The second groove includes a second opening having a second width. The first width is smaller than the second width.

Other aspects of the invention will become apparent by consideration of the detailed description and accompanying drawings.

DETAILED DESCRIPTION

Figure 1:
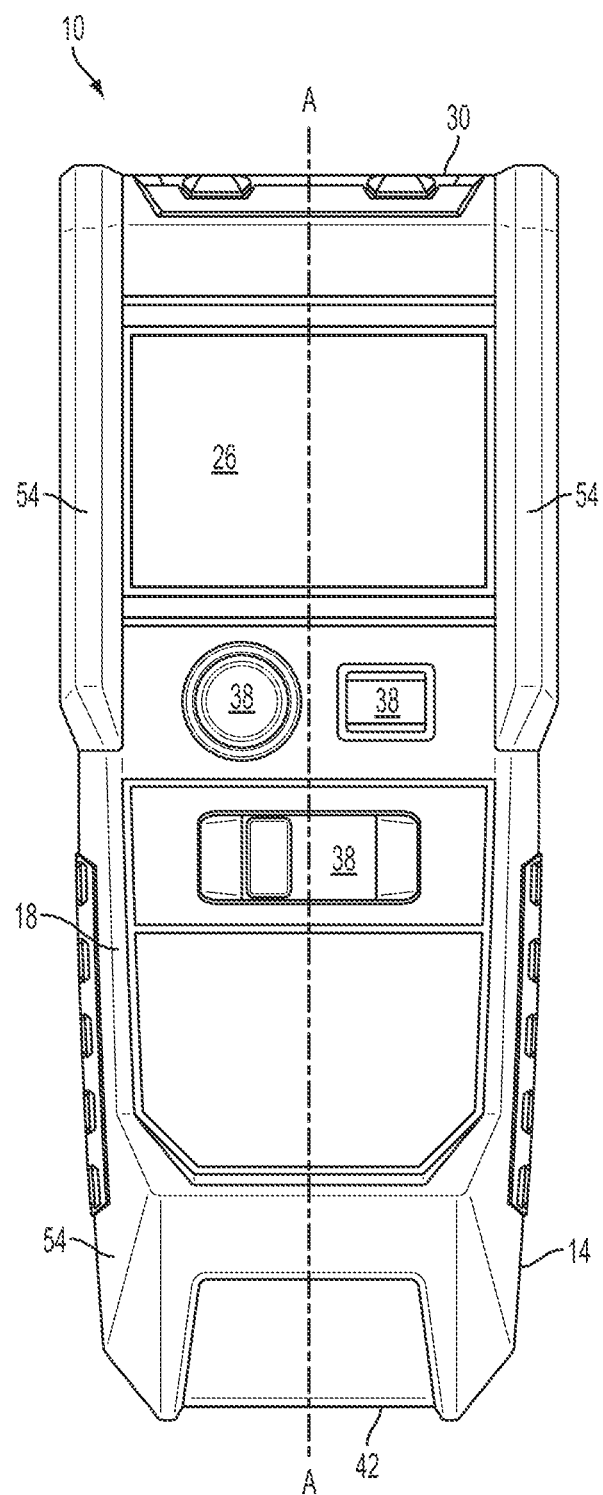
FIG. 1 is a front view of a test and measurement device according to an embodiment of the invention.
Figure 2:
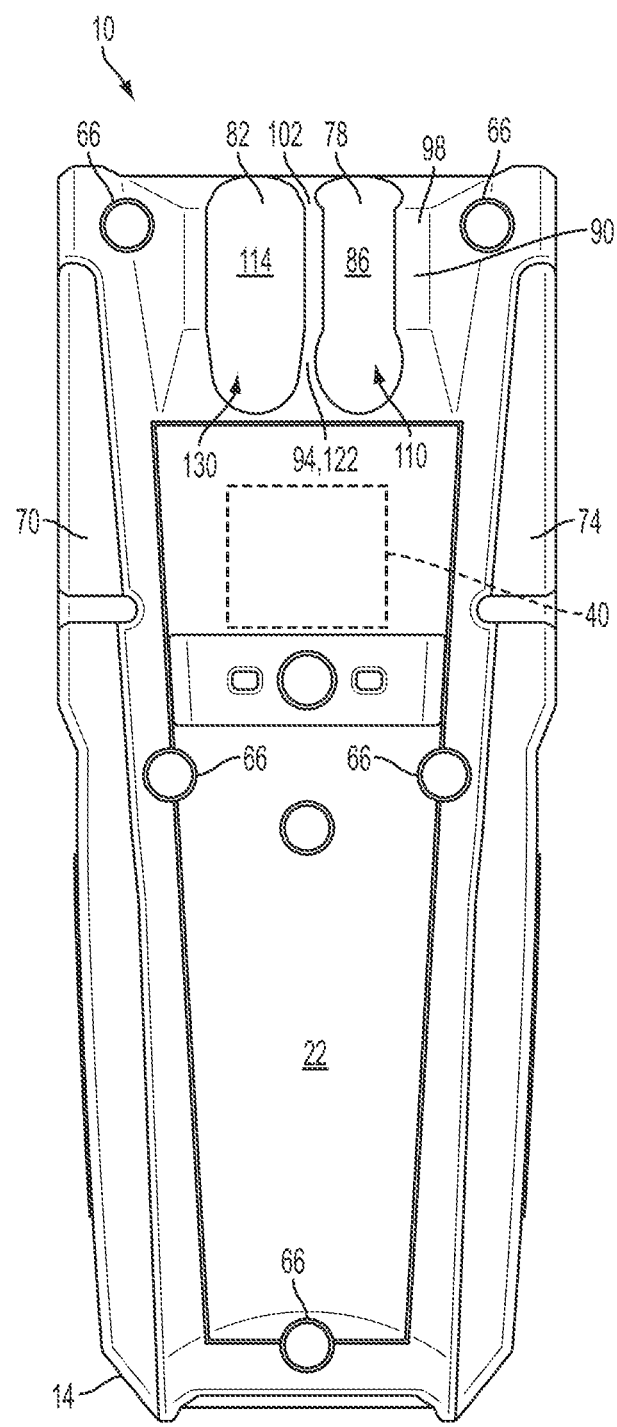
FIG. 2 is a rear view of the test and measurement device of FIG. 1.
Figure 3:
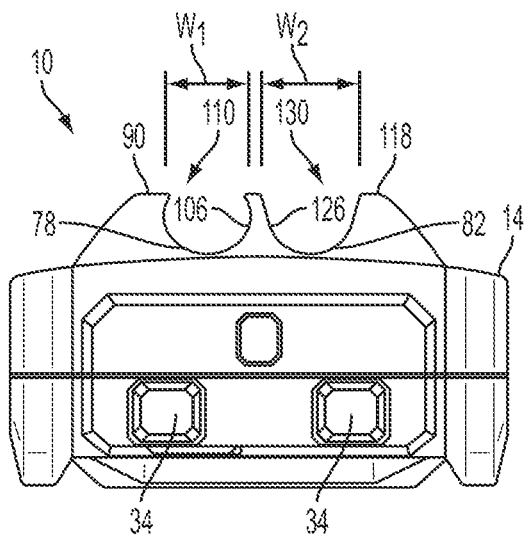
FIG. 3 is a top view of the test and measurement device of FIG. 1.
Figure 4:
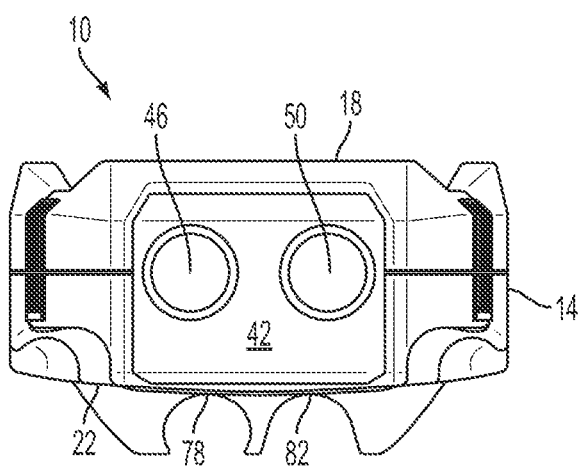
FIG. 4 is a bottom view of the test and measurement device of FIG. 1.
Figure 5:
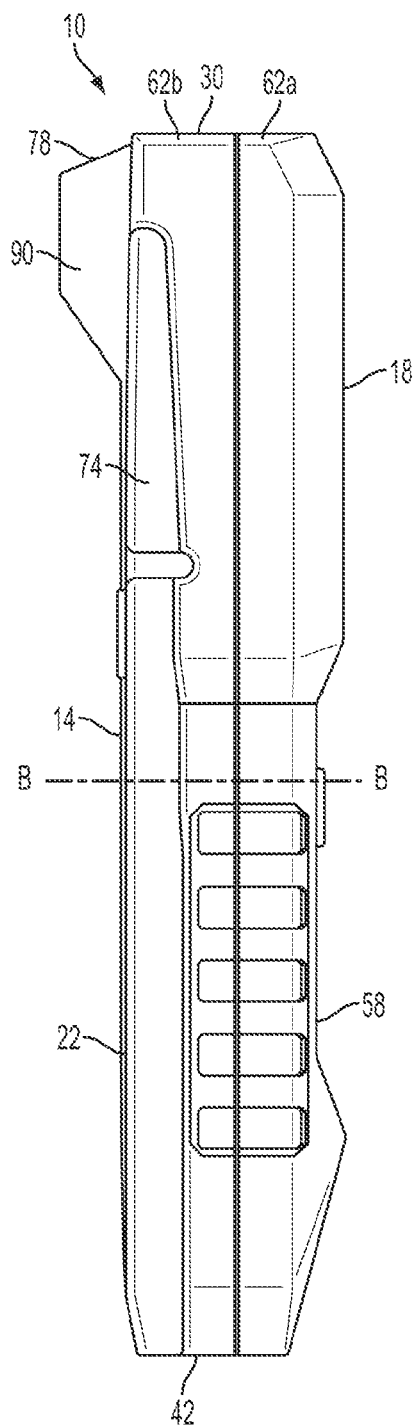
FIG. 5 is a left side view of the test and measurement device of FIG. 1.
Figure 6:
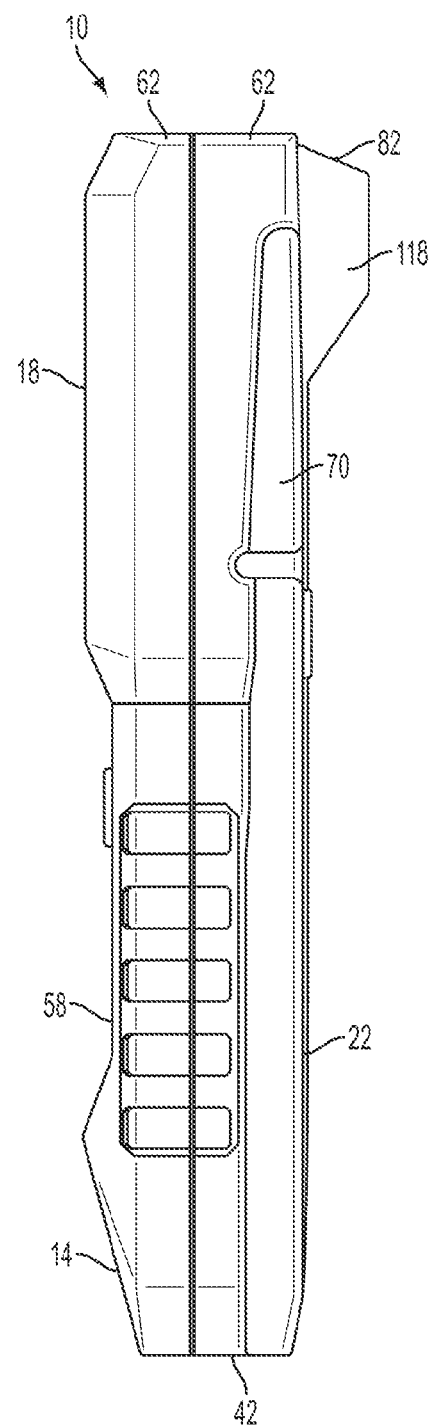
FIG. 6 is a right side view of the test and measurement device of FIG. 1.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

FIGS. 1-15 illustrate a test and measurement device 10. The device 10 includes a housing 14 having a first or front side 18 that is opposite a second or rear side 22. A display 26 is located on the front side 18. Additionally, the front side 18 and a first or top end 30 of the housing 14 include several indicators (e.g., LEDs, etc.) 34 and switches 38. The housing 14 may enclose a circuit 40, which may be mounted on a printed circuit board, for example. The circuit 40 may drive the various functions of the device 10. For example, the circuit 40 may enable the device 10 to function to measure one or more of AC voltage, DC voltage, resistance, and/or continuity based on a functional mode selected using the switches 38, which are in communication with the circuit 40. A second or bottom end 42 of the housing 14 includes a first terminal 46 and a second terminal 50. The first terminal 46 and the second terminal 50 are each in electrical communication with the circuit 40.

In each of the embodiments described herein, the housing 14 includes overmolded members or walls 54 that extend from the front side 18 and that at least partially surround the display 26 and the indicators 34 and switches 38. The walls 54 protect the display 26 and prevent the switches 38 from being accidentally pushed or actuated. Additionally, the housing 14 is shaped to be wider near the top end 30 and narrow near the bottom end 42 to facilitate the housing of being held in a user's hand. The housing 14 also includes gripping members 58 near the bottom end that provide comfort and anti-slip support to the user. In additional or alternative embodiments, the housing 14 may have other configurations (i.e., shapes and sizes). Accordingly, other embodiments may include a display 26 having a size or shape other than what is illustrated herein. Further, the housing 14 may include different placements of the indicators 34 and switches 38, may include more indicators 34 or switches 38 such that the device 10 may have additional functions, or may include fewer indicators 34 or switches 38 such that the device 10 has fewer functions.

In the illustrated embodiments, the housing 14 is a clamshell housing 62 (e.g., made from plastic, etc.) having a first clamshell half 62a and a second clamshell half 62b, which are coupled by one or more fasteners 66 (i.e., screws and the like) to enclose the circuit 40. In additional or alternative embodiments the housing 14 is constructed from other suitable materials (e.g., metal) and may be constructed by alternative methods (e.g., adhesively coupled, integrally formed, etc.).

With reference to the devices 10 of FIGS. 1-13, the housing 14 includes a first recess 70 and second recess 74. In the illustrated embodiments, the first recess 70 and the second recess 74 are disposed on and extend along opposite sides of the rear side 22 of the housing 14. Other embodiments of the devices 10 may include the recesses 70, 74 at different locations in the housing 14.

The housing 14 also includes a first groove 78 and a second groove 82, which are formed on the rear side 22 of the housing 14. The first groove 78 includes a first arcuate surface 86, a first wall 90, and a second wall 94. The first groove 78 includes an opening 110 that is disposed between the first wall 90 and the second wall 94 and defines a first width W1. In each of the embodiments, a first projection 98 is formed on the first wall 90 while a second projection 102 is formed on the second wall 94. Additionally, in the embodiment of FIGS. 1-8 the second wall 94 defines a substantially concave surface 106 of the first groove 78. The second projection 102 is at least partially defined by the concave surface 106 in the embodiments of FIGS. 1-8. The first width W1 of the opening 110 is defined between the first projection 98 and the second projection 102, and therefore the concave surface 106. The second groove 82 also includes an arcuate surface 114, a first wall 118, and a second wall 122. In the embodiment of FIGS. 1-8 the second wall 122 defines a substantially convex surface 126 of the second groove 82. Alternatively, as illustrated in the embodiment of FIGS. 9-13, the second wall 122 may include a perpendicular surface 126'. In either embodiment, like the first groove 78, the second groove 82 also includes an opening 130 that is disposed between the first wall 118 and the second wall 122. The opening 130 includes a second width W2 that is disposed between the first wall 118 and the second wall 122. The second width is defined by either the convex surface 126 or the perpendicular surface 126'. The first width W1 is smaller than the second width W2. In the illustrated embodiments, the second wall 94 of the first groove 78 is integrally formed with the second wall 122 of the second groove 82. In other embodiments, the second wall 94 of the first groove 78 may be formed separately from the second wall 122 of the second groove 82 such that the second walls 94, 122 are unique structures (i.e., spaced apart from one another). In the illustrated embodiments, the first groove 78 and the second groove 82 are disposed on and project from the rear side 22 of the housing 14. Other embodiments of the device 10 may include grooves 78, 82 at other locations in the housing 14 (e.g., on the sides or front of the housing 14).

The test and measurement device 10 also includes a first probe 134 and a second probe 138. The first probe 134 includes a first probe body 142, a first conductive tip 146, and a first probe wire 150, which ends with a first coupling member 154. Similarly, the second probe 138 includes a second probe body 158, a second conductive tip 162, and a second probe wire 166, which ends with a second coupling member 170. The first probe 134 and the second probe 138, which are substantially interchangeable, removably couple to the housing 14 via coupling members 154, 170, respectively, to be in electrical communication with the circuit 40. In particular, the first terminal 46 and the second terminal 50 in the housing 14 are configured to receive the coupling members 154, 170 of the probes 134, 138. Therefore, either of the first coupling member 154 or the second coupling member 170 may be received within and secured to either the first terminal 46 or the second terminal 50. Accordingly, the other of the first coupling member 154 or the second coupling member 170 may be received within and secured to the other of the first terminal 46 or the second terminal 50. Therefore, when the coupling members 154, 170 are secured within the terminals 46, 50, the probes 134, 138 may electrically communicate with the circuit 40 of the device 10. For example, if a user selects a button corresponding to DC volts, the device 10 functions as a DC voltmeter. Similarly, if the user selects a button corresponding to resistance, the device 10 may function as an ohmmeter. In each instance, corresponding circuitry supporting the desired functionality is electrically coupled to the probes 134, 138.

The housing 14 provides a first or use position and a second or non-use position for the probes 134, 138. The grooves 78, 82 are configured to receive the probe bodies 142, 158 against the housing 14 when in use (i.e., the use position). In each of the illustrated embodiments, the first groove 78 is configured to receive one of the first probe body 142 of the first probe 134 or the second probe body 158 of the second probe 138. The projections 98, 102 retain the one of the first probe body 142 or the second probe body 158 within the first groove 78. The first groove 78 secures the one of the first probe body 142 or the second probe body 158 with the first groove 78 by, for example, a snap-fit engagement therebetween. As such, the one of the first probe body 142 or the second probe body 158 fits securely within the opening 110 of the first groove 78 during use.

Figure 7A:
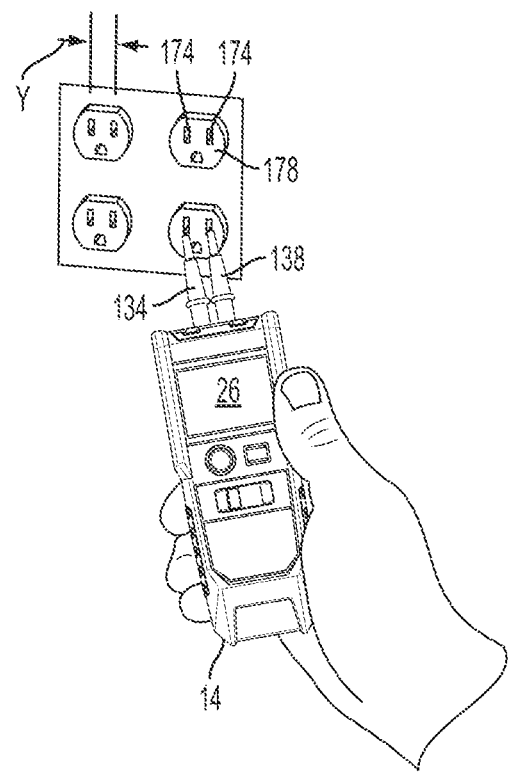
FIG. 7A is a front prospective view of the test and measurement device of FIG. 1 including a first probe and a second probe in a first use position.
Figure 14:
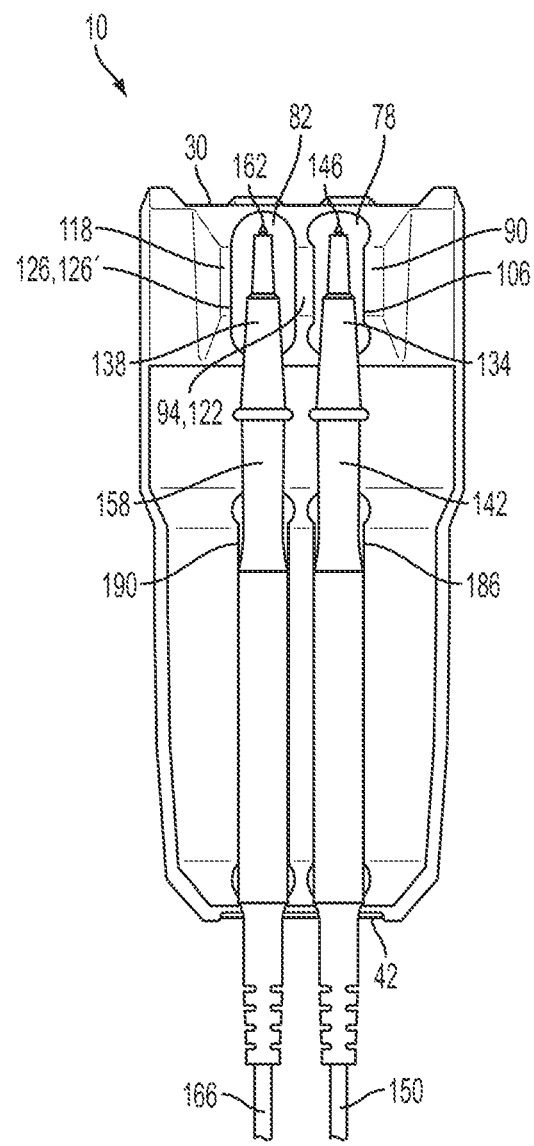
FIG. 14 is a rear view of a test and measurement device according to another embodiment of the invention in a non-use position.
Figure 15:
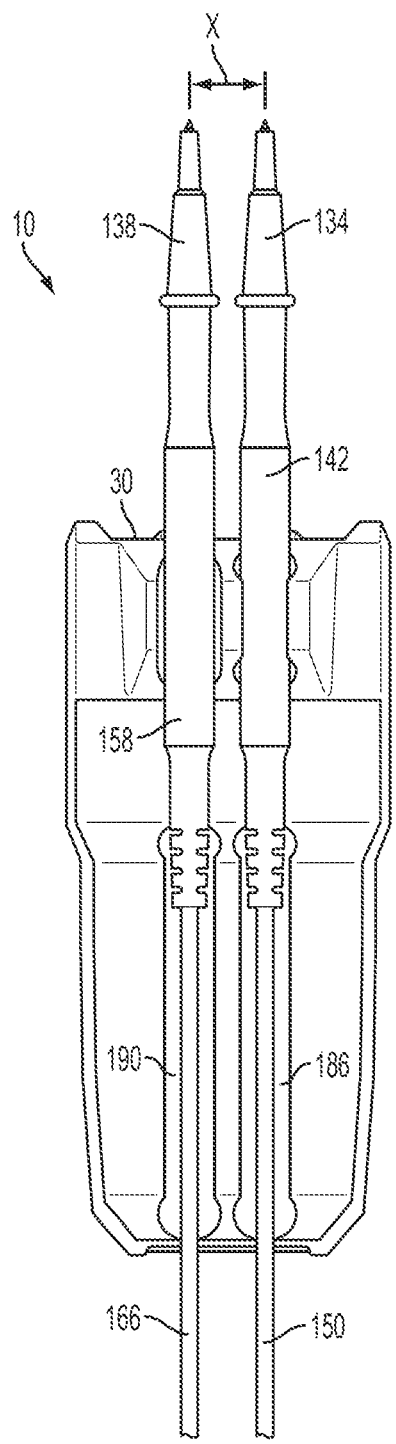
FIG. 15 is a rear view of a test and measurement device of FIG. 14 in a use position.

Further with respect to FIGS. 7A, 14, and 15, the second groove 82 receives the other of the first probe body 142 or the second probe body 158. The second width W2 of the second groove 82 is sized such that the other of the first probe body 142 or the second probe body 158 is slidable within the opening 130. When the other of the first probe body 142 or the second probe body 158 is received within the second groove 82, the user manually retains the other of the first probe body 142 or the second probe body 158 within the second groove 82. The other of the first probe body 142 or the second probe body 158 is not secured within the second groove 82 without external support (e.g., from a user). When both the first probe body 142 and the second probe body 158 are received by the grooves 78, 82, the first and the second probes 134, 138 are spaced apart from and in parallel with one another. Further, the first and second grooves 78, 82 are spaced relative to one another such that when both the first probe body 142 and the second probe body 158 are received by the grooves 78, 82, the conductive tips 146, 162 are spaced apart from each other by a distance, X, that is substantially equal to a standard distance, Y, between adjacent openings 174 of an electrical outlet 178, (e.g., ½ inch). As such, in the illustrated embodiment, the first groove 78 is spaced apart from the second groove 82 by approximately 0.5 inches. The first and the second grooves 78, 82 may be spaced from one another by alternate distances in additional embodiments (e.g., between ¼ inch and 2 inches).

Figure 7B:
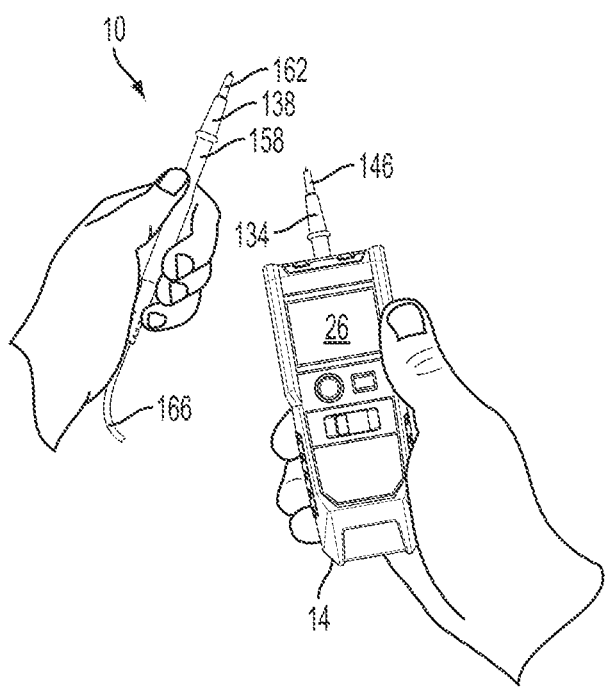
FIG. 7B is a front perspective view of the test and measurement device of FIG. 1 including a first probe and a second probe in a second use position.

Further with respect to FIG. 7B, the second groove 82 may not receive the other of the first probe body 142 or the second probe body 158 during use. In other words, the other of the first probe body 142 or the second probe body 158 may be spaced apart or displaced from the second groove 82 during use.

Figure 8:
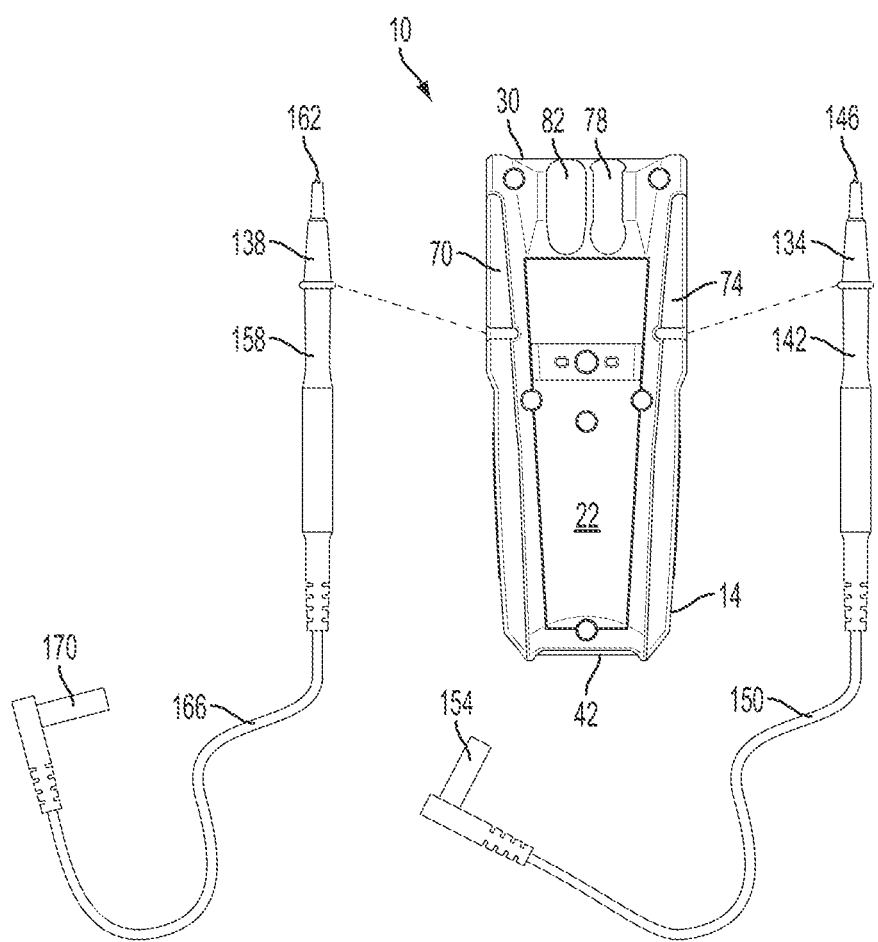
FIG. 8 is an exploded view of the test and measurement device of FIG. 1 including a first probe and a second probe in a non-use position.
Figure 9:
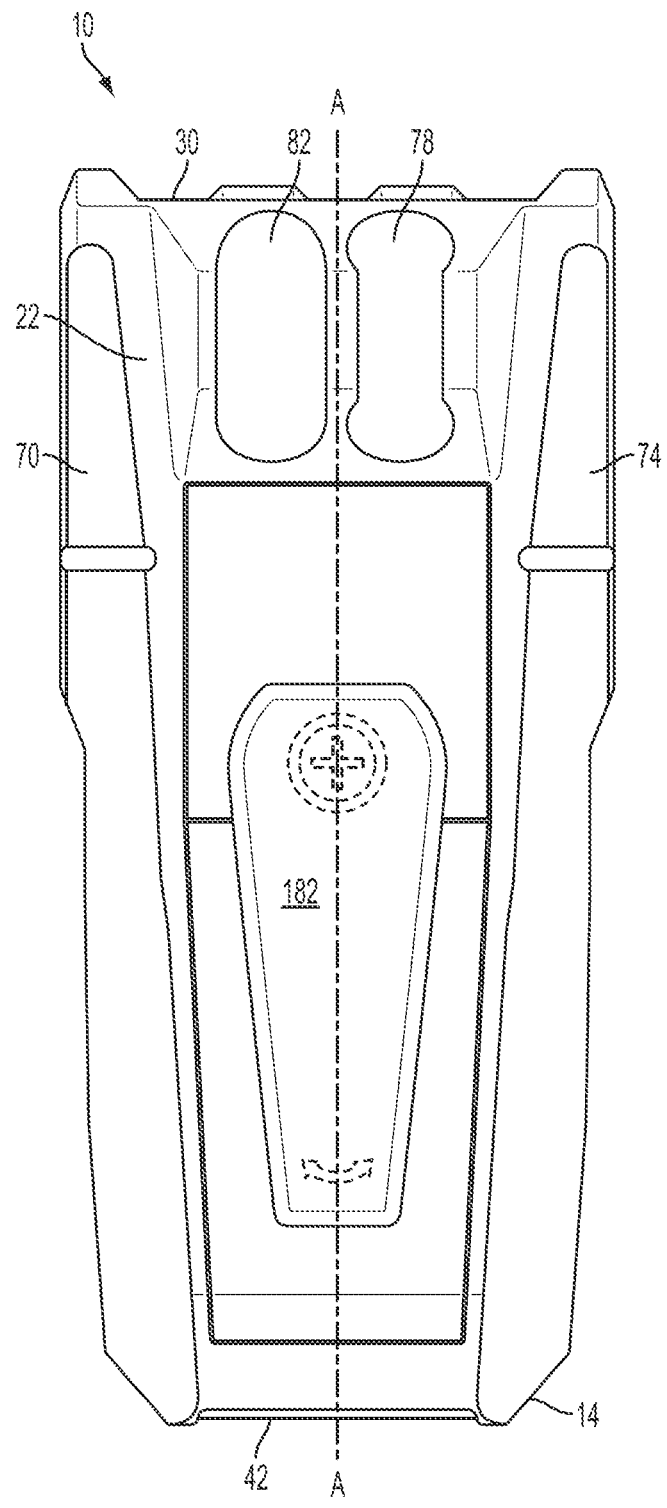
FIG. 9 is a rear view of a test and measurement device according to another embodiment of the invention.
Figure 10:
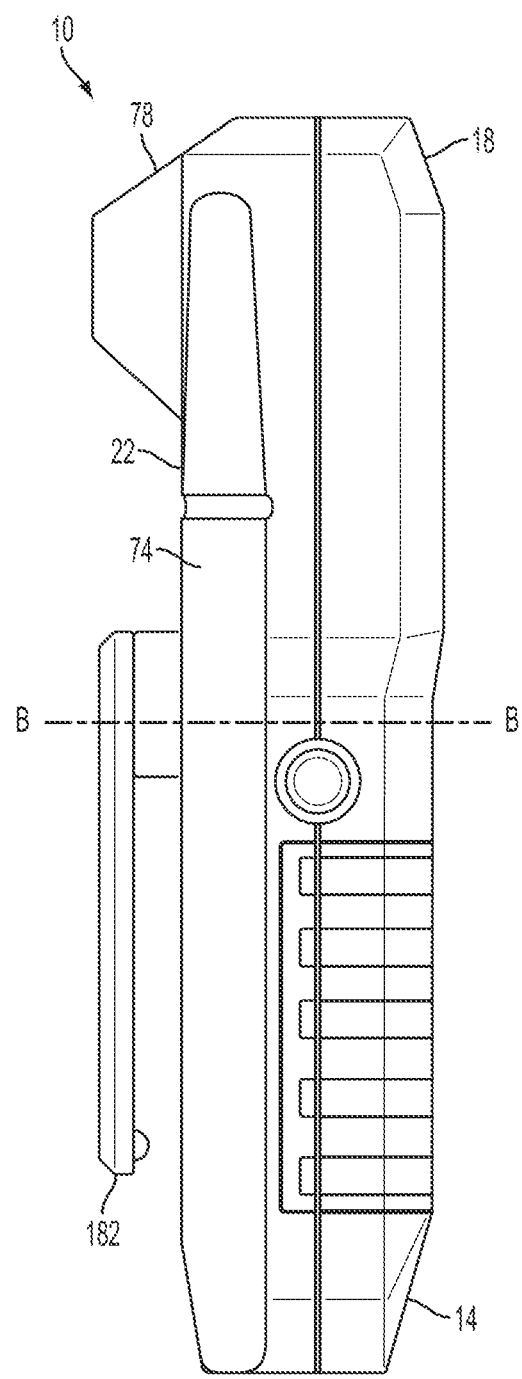
FIG. 10 is a left side view of the test and measurement device of FIG. 9.

With reference to FIG. 8, the recesses 70, 74 are configured to receive and retain the probe bodies 142, 158 against the housing 14 of the device 10 when not in use (i.e., the non-use position). Therefore, as illustrated, the first recess 70 is substantially sized and shaped to receive either the first probe body 142 of the first probe 134 or the second probe body 158 of the second probe 138. Likewise, the second recess 74 is substantially sized and shaped to receive the other of the first probe body 142 of the first probe 134 or the second probe body 158 of the second probe 138. In the illustrated embodiment, the probe bodies 142, 158 are secured within the recesses 70, 74 by a snap-fit engagement therebetween.

Figure 11:
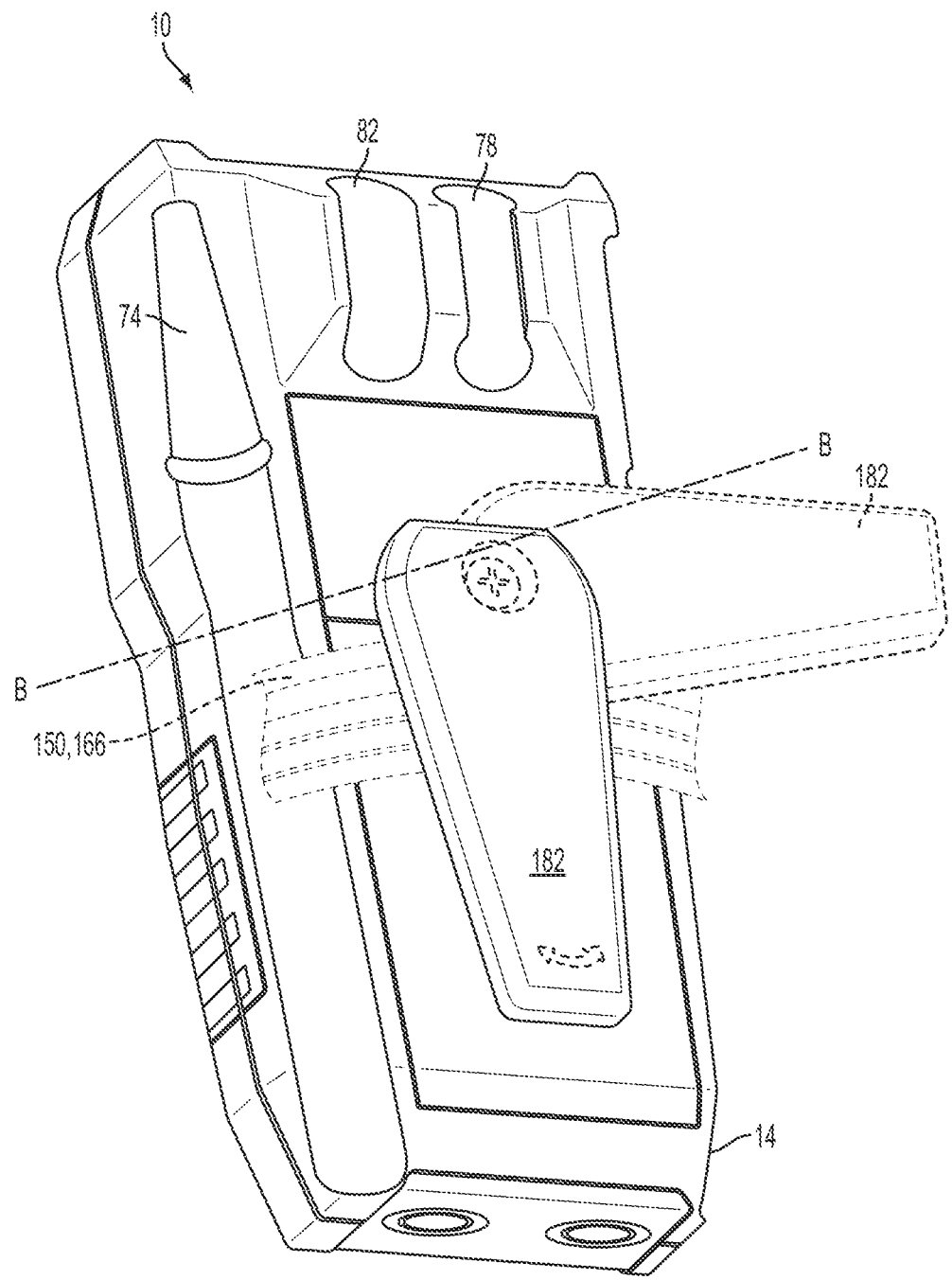
FIG. 11 is a rear perspective view of the test and measurement device of FIG. 9.
Figure 12:
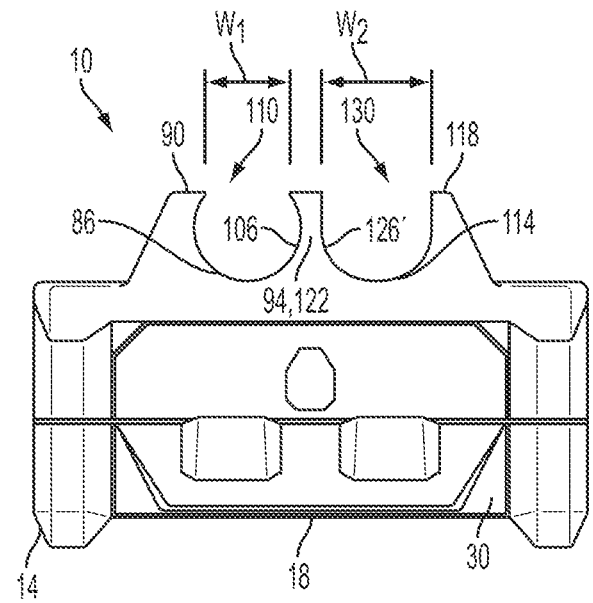
FIG. 12 is a top view of the test and measurement device of FIG. 9.
Figure 13:
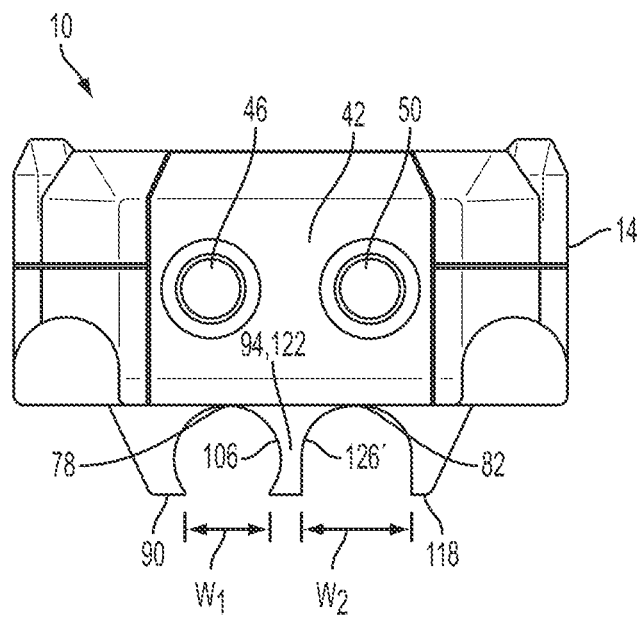
FIG. 13 is a bottom view of the test and measurement device of FIG. 9.

In the embodiment of the device 10 illustrated in FIGS. 9-15, an auxiliary projection 182 is removably coupled (i.e., by a fastener or snap-fit engagement) to the rear side 22 of the housing 14. As illustrated in FIG. 11, the projection 182 may be rotatably about an axis B that is perpendicular to the longitudinal axis A. The projection 182 is configured to retain the first probe wire 150 and the second probe wire 166 of the first probe 134 and the second probe 138, respectively, against the housing 14 when wound about the housing 14. As such, the projection 182 secures the first and the second probe wires 150, 166 to the housing 14 when in the non-use position or eliminates slack from the wires 150, 166 when in use. In additional embodiments, the projection 182 is integrally formed with the housing 14.

With reference to FIGS. 14-15, a third groove 186 and a fourth groove 190 may project from the rear side 22 of the housing 14. The third groove 186 is aligned with and spaced apart from the first groove 78 while the fourth groove 190 is aligned with and spaced apart from the second groove 82. The third groove 186 and the fourth groove 190 are each configured to slidingly receive at least a portion of one of the first probe 134 or the second probe 138. FIG. 15 illustrates a similar use position similar to that described above with respect to FIG. 7A.

Thus, the invention provides, among other things, a test and measurement device including a cord management system. It should also be understood that any or all of the features of any of the embodiments described herein may be combined in additional or alternative embodiments. Various features and advantages of the invention are set forth in the following claims.

What is claimed is:

1. A test and measurement device comprising:
a housing;
a circuit disposed within the housing;
a display located on a first side of the housing;
a first probe including a first probe body, a first conductive tip, and a first probe wire, the first probe coupled to the housing and in electrical communication with the circuit;
a second probe including a second probe body, a second conductive tip, and a second probe wire, the second probe coupled to the housing and in electrical communication with the circuit;
a first groove including a first projection and a second projection, the first groove configured to receive the first probe body, the first projection and the second projection configured to retain the first probe body within the first groove;
a second groove configured to receive the second probe body;
a first recess configured to receive the first probe body; and
a second recess configured to receive the second probe body,
wherein the first groove receives the first probe body and the second groove receives the second probe body in a use position, in which the first and second probes can be used to make electrical measurements, and
wherein the first recess receives the first probe body and the second recess receives the second probe body in a non-use position, in which the first and second probes cannot be used to make electrical measurements.

2. The test and measurement device of claim 1, wherein the housing includes a first terminal configured to receive a coupling member of the first probe wire, and a second terminal configured to receive a coupling member of the second probe wire.

3. The test and measurement device of claim 1, wherein the first groove includes a first arcuate surface, a first wall, and a second wall, and the second groove includes a second arcuate surface, a third wall, and a fourth wall.

4. The test and measurement device of claim 3, wherein the second wall of the first groove is integrally formed with the fourth wall of the second groove.

5. The test and measurement device of claim 3, wherein the first projection and the second projection define a first width of an opening of the first groove, and the third wall and the fourth wall of the second groove define a second width of an opening of the second groove, the first width being smaller than the second width.

6. The test and measurement device of claim 5, wherein the second wall of the first groove defines a substantially concave surface of the first groove, and the fourth wall of the second groove defines a substantially convex surface of the second groove.

7. The test and measurement device of claim 1, wherein the first groove includes a first opening having a first width and the second groove includes a second opening having a second width, the first width being smaller than the second width.

8. The test and measurement device of claim 1, wherein the first probe body is secured by a snap-fit engagement within the first groove.

9. The test and measurement device of claim 1, wherein the first probe body is secured by a snap-fit engagement within the first recess, and the second probe body is secured by a snap-fit engagement within the second recess.

10. A test and measurement device comprising:
a housing;
a circuit disposed within the housing;
a first probe including a first probe body, a first conductive tip, and a first probe wire, the first probe coupled to the housing and in electrical communication with the circuit;
a second probe including a second probe body, a second conductive tip, and a second probe wire, the second probe coupled to the housing and in electrical communication with the circuit;
a first groove formed on the housing and including a first projection and a second projection;
a second groove formed on the housing;
a first recess formed on the housing apart from the first groove;
a second recess formed on the housing apart from the second groove;
a non-use position of the first probe and the second probe in which the first probe body is received in the first recess, but not the first groove and the second probe body is received in the second recess, but not the second groove; and
a use position of the first probe in which the first probe body is received and secured within the first groove.

11. The test and measurement device of claim 10, wherein, when in the use position, the second probe body is slidably received by the second groove.

12. The test and measurement device of claim 10, wherein, when in the use position, the second probe body is displaced from the second groove.

13. The test and measurement device of claim 10, wherein the housing includes a first terminal configured to receive a coupling member of the first probe wire, and a second terminal configured to receive a coupling member of the second probe wire.

14. The test and measurement device of claim 10, wherein the first groove includes a first arcuate surface, a first wall, and a second wall, and the second groove includes a second arcuate surface, a third wall, and a fourth wall.

15. The test and measurement device of claim 14, wherein the first projection and the second projection define a first width of an opening of the first groove, and the third wall and the fourth wall of the second groove define a second width of an opening of the second groove, the first width being smaller than the second width.

16. The test and measurement device of claim 10, wherein, when in the use position, the first probe body is secured by a snap-fit engagement within the first groove.

17. A test and measurement device comprising:
a housing;
a circuit disposed within the housing;
a first probe including a first probe body, a first conductive tip, and a first probe wire, the first probe coupled to the housing and in electrical communication with the circuit;
a second probe including a second probe body, a second conductive tip, and a second probe wire, the second probe coupled to the housing and in electrical communication with the circuit;
a first groove including a first projection and a second projection, the first groove configured to receive one of the first probe body or the second probe body, the first groove including a first opening having a first width;
a second groove configured to receive the other of the first probe body or the second probe body, the second groove including a second opening having a second width,
wherein the first width is smaller than the second width,
wherein the first groove includes a first accurate surface, a first wall, and a second wall, and the second groove includes a second arcuate surface, a third wall, and fourth wall,
wherein the first width is defined by a distance between the first projection and the second projection of the first groove, and the second width is defined by a distance between the third wall and the fourth wall of the second groove, and
wherein the second wall of the first groove defines a substantially concave surface of the first groove, and the fourth wall of the second groove defines a substantially convex surface of the second groove.

18. The test and measurement device of claim 17, wherein the housing includes a first terminal configured to receive a coupling member of one of the first probe wire or the second probe wire and a second terminal configured to receive a coupling member of the of the other of the first probe wire or the second probe wire.

19. The test and measurement device of claim 17, wherein the one of the first probe body or the second probe body is secured by a snap-fit engagement within the first groove.

20. The test and measurement device of claim 17, further comprising:
a first recess configured to receive one of the first probe body or the second probe body; and
a second recess configured to receive the other of the first probe body or the second probe body.

21. The test and measurement device of claim 20, wherein the first recess and the second recess receive the first probe body or the second probe body in a non-use position.

22. The test and measurement device of claim 21, wherein the one of the first probe body or the second probe body is secured by a snap-fit engagement within the first recess and the other of the first probe body or the second probe body is secured by a snap-fit engagement within the second recess.

* * * * *